(12) United States Patent
Epshteyn et al.

(10) Patent No.: US 6,461,441 B1
(45) Date of Patent: Oct. 8, 2002

(54) METHOD OF REMOVING DEBRIS FROM CLEANING PADS IN WORK PIECE CLEANING EQUIPMENT

(75) Inventors: Yakov Epshteyn, Phoenix, AZ (US); Frank Krupa, Phoenix, AZ (US); Ellis Harvey, Chandler, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/851,866

(22) Filed: May 9, 2001

(51) Int. Cl.[7] .............. B08B 1/00; B08B 1/02; B08B 3/00; B08B 3/02; B08B 3/04
(52) U.S. Cl. .............. 134/6; 134/25.5; 134/26; 134/32; 134/33; 134/42; 134/902
(58) Field of Search .............. 134/6, 25.5, 26, 134/32, 33, 42, 902

(56) References Cited

U.S. PATENT DOCUMENTS

| | | | |
|---|---|---|---|
| 4,786,333 A | * 11/1988 | Kaiser | 134/6 |
| 5,624,501 A | * 4/1997 | Gill, Jr. | 134/6 |
| 5,639,311 A | 6/1997 | Hollev et al. | |
| 5,693,148 A | 12/1997 | Simmons et al. | |
| 5,701,626 A | 12/1997 | Zara et al. | |
| 5,804,507 A | * 9/1998 | Perlov et al. | 438/692 |
| 5,862,822 A | * 1/1999 | Borders et al. | |
| 5,868,857 A | 2/1999 | Moinpour et al. | |
| 5,976,267 A | 11/1999 | Culkins et al. | |
| 6,182,323 B1 | 2/2001 | Bahten | |
| 6,200,199 B1 | * 3/2001 | Gurusamy et al. | 451/56 |

* cited by examiner

*Primary Examiner*—Zeinab El-Arini
(74) *Attorney, Agent, or Firm*—James L. Farmer

(57) ABSTRACT

The cleaning pads (102, 104) that are used to clean work pieces (200), such as semiconductor wafers, are cyclically compressed against one another and rinsed with a rinsing fluid. By cyclically compressing the cleaning pads (102, 104) together and rinsing them, the debris that the cleaning pads remove from the work pieces (200) and that becomes embedded in, and adhered to, the cleaning pads (102, 104) is subsequently removed therefrom.

39 Claims, 11 Drawing Sheets

METHOD OF REMOVING DEBRIS FROM CLEANING PADS IN WORK PIECE CLEANING EQUIPMENT

BACKGROUND OF THE INVENTION

1. Field of the Invention

The present invention relates to a method of cleaning work pieces, such as semiconductor wafers, and, more particularly, to a method of removing debris from cleaning pads used to clean the work pieces.

2. Description of Related Art

Semiconductor wafers are subjected to various processing steps during fabrication. Such processing steps include growth or deposition of insulating layers, deposition of conductive layers, doping with one or more impurities, planarization, and other steps known to the skilled artisan. A high level of wafer cleanliness is required to be maintained during the fabrication process. As a result, many of the processing steps are either preceded or proceeded by one or more cleaning steps to ensure the appropriate level of wafer cleanliness is maintained.

Wafer cleaning, especially after a wafer planarization process, such as chemical-mechanical planarization (CMP), involves cleaning the wafer surface with a cleaning pad, brush, or sponge. This cleaning process removes various forms of debris, such as particulate, residue, and other contaminants remaining on the wafer surface after the CMP process. Following the wafer cleaning process, especially following a post-CMP process cleaning, much of this debris is adhered to, and may be embedded in, the cleaning pads. If the concentration of the debris collected by the cleaning pads becomes sufficiently high, the collected debris may cause damage to wafers that are subsequently cleaned using the same cleaning pads.

Naturally, from an economic standpoint it is desirable that the wafer fabrication process be conducted rapidly, efficiently, and with a high volume throughput. Thus, it is desirable to have a process for rapidly and efficiently removing the debris collected by the cleaning pads during the wafer cleaning process so that wafer damage can be prevented. Furthermore, it is desirable that the process used to remove the debris from the cleaning pads be fully integrated into the wafer fabrication process and processing equipment.

Presently, wafer cleaning apparatuses and methods employ so-called "beater bars" or use filler wafers to remove the debris from the cleaning pads. If a beater bar type of pad cleaner is used, debris is removed from a cleaning pad by compressing the cleaning pad against a beater bar, in a separate fluid bath, and rotating the pad. Such a system requires the construction and use of a separate pad cleaning station, in addition to the other wafer conditioning stations within the equipment. Thus, this system impacts overall system throughput and complexity, thereby increasing overall system costs. The use of filler wafers also adversely affects system throughput, since the normal wafer process must be stopped in order to process the filler wafers. Yet another alternative is to simply replace the cleaning pads periodically. This alternative also adversely affects throughput and overall cost.

Hence, there is a need in the art for a method of removing debris from the cleaning pads in work piece cleaning equipment that improves upon the drawbacks noted above. Namely, a method of removing debris that does adversely affect work piece throughput by requiring either a separate pad cleaning station, use of separate filler wafers, or frequent, periodic replacement of the cleaning pads.

SUMMARY OF THE INVENTION

The present invention provides a method for removing debris from cleaning pads used in work piece cleaning equipment that does not require a separate station or system for removing debris from the cleaning pads, does not require the use of special filler wafers to remove the debris therefrom, nor requires frequent replacement of the cleaning pads.

In one aspect of the present invention, a method of removing debris from cleaning pads in a work piece cleaning apparatus includes a compression force application and removal step and a rinsing step. The compression force application and removal step includes cyclically applying and removing a compression force to cause a first cleaning pad to compress against a second cleaning pad. The cyclical application and removal of the compression force occurs for a predetermined number of force application/removal cycles. The rinsing step comprises applying a rinsing fluid to the first and second cleaning pads.

In another aspect of the invention, a method of cleaning a work piece includes bringing a first surface of the work piece into contact with a first cleaning pad, and bringing a second surface of the work piece into contact with a second cleaning pad. In the presence of a cleaning fluid, one or more of the first and second surfaces of the work piece are cleaned with the first and second cleaning pads. The work piece is removed from contact with the first and second cleaning pads, and the cleaning pads are thereafter cleaned. The process of cleaning the cleaning pads includes a compression force application and removal step and a rinsing step. The compression force application and removal step includes cyclically applying and removing a compression force to cause a first cleaning pad to compress against a second cleaning pad. The cyclical application and removal of the compression force occurs for a predetermined number of force application/removal cycles. The rinsing step comprises applying a rinsing fluid to the first and second cleaning pads.

Other features and advantages of the present invention will become apparent from the following detailed description, taken in conjunction with the accompanying drawings, which illustrate, by way of example, the principles of the present invention.

DETAILED DESCRIPTION OF PREFERRED EMBODIMENTS

Before proceeding with the description of the various embodiments of the present invention, it is to be appreciated that the present invention is not limited to use with systems that are used to clean semiconductor wafers. Thus, although the present description is explicitly described as being implemented in a semiconductor wafer cleaning system, the present invention is also applicable to cleaning systems for other devices, such non-limiting examples of which include compact discs and optical blanks. Hence, use of the term "work piece" throughout the present application is not intended to be limited to semiconductor wafers.

Figure 1:
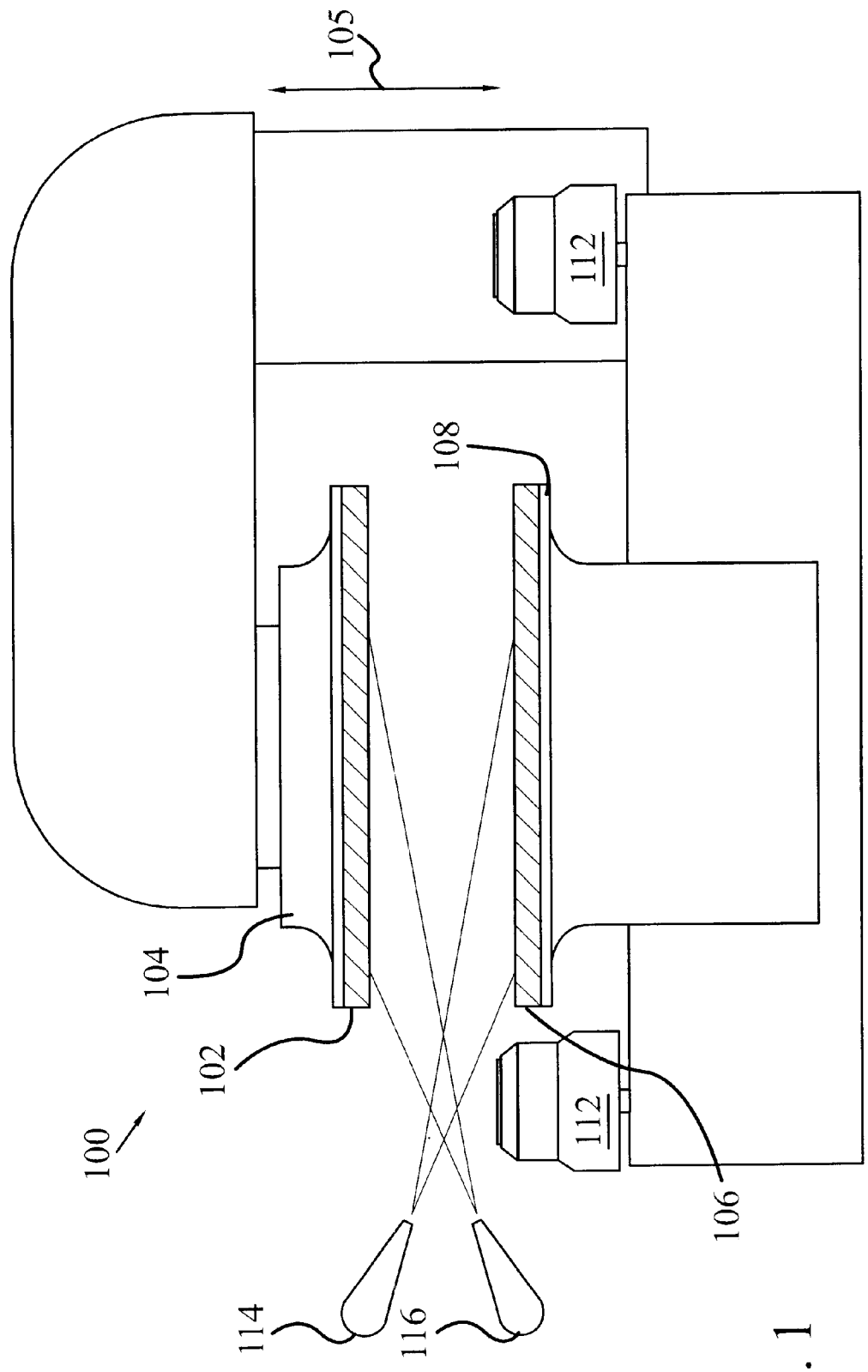
FIGS. 1 and 2 depict a simplified side view of an exemplary work piece cleaning station employing an embodiment of the present invention.
Figure 2:
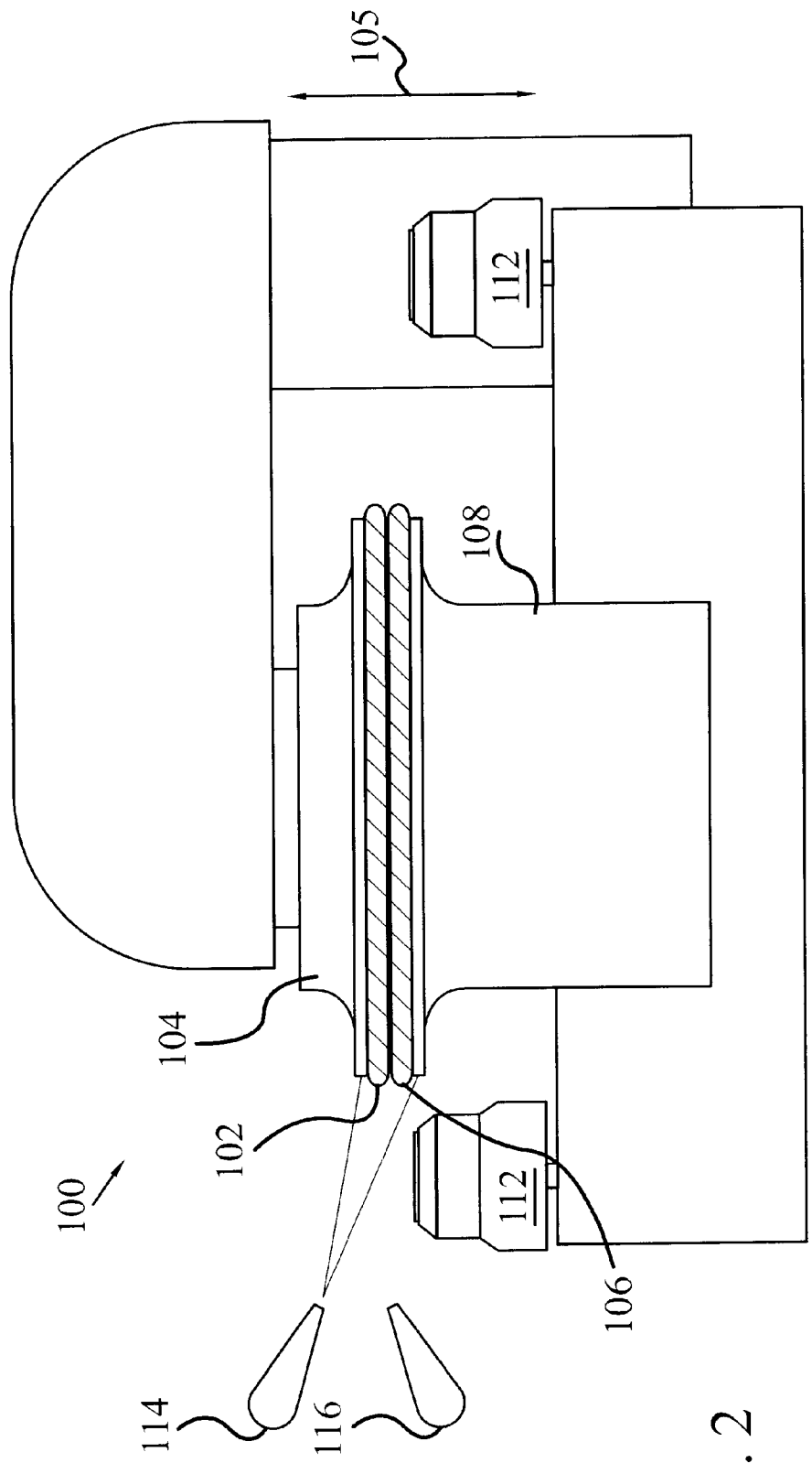

Turning now to the description, and with reference first to FIGS. 1 and 2, a simplified side view of a work piece cleaning station 100 employing an embodiment of the present invention is depicted. The cleaning station 100 includes a first cleaning pad 102 mounted to an upper cleaning pad mount 104, and a second cleaning pad 106 mounted to a lower cleaning pad mount 108. The upper 104 and lower 108 cleaning pad mounts may each be movable both rotationally and translationally. More particularly, either or both of the upper 104 and lower 108 cleaning pad mounts are movable in the vertical direction, as depicted by the double-headed arrow 105, to thereby bring the first 102 and second 106 cleaning pads into contact with each other. In either case, however, both the upper 104 and lower 108 cleaning pad mounts are also movable rotationally, to thereby rotate the first 102 and second 106 cleaning pads. The upper 104 and lower 108 cleaning pad mounts may be moved vertically and/or rotationally using any one of numerous methods known in the art. For example, one or more non-depicted motors, under the control of a non-depicted controller, may be used to rotate and translate the cleaning pad mounts 104, 108. The particular number and structure of the devices used to rotate and translate the cleaning pad mounts 104, 108, as well as the particular controller, are not critical to the present invention.

The cleaning station 100 further includes a plurality of lateral support, rotary bearing elements 112 positioned proximate a peripheral portion of the cleaning station 100. These bearing elements 112 provide lateral support for a work piece during the work piece cleaning process (briefly described below). Additionally, since the bearing elements 112 can rotate, the work piece that is being cleaned is allowed to concomitantly rotate. Although only two bearing elements 112 are depicted, it is to be appreciated that the present invention is not limited to any particular structure or number of bearing elements 112.

In the embodiment depicted in FIGS. 1 and 2, one or more fluid spray nozzles 114, 116 are positioned proximate the first 102 and second 106 cleaning pads. These spray nozzles 114, 116 deliver fluid from a non-depicted fluid source during the work piece cleaning process to ensure the first 102 and second 106 cleaning pads remain sufficiently wetted. As will be explained further below, the preferable material used for the cleaning pads 102, 106 makes it advantageous to keep the cleaning pads 102, 106 wetted. Although upper 114 and lower 116 spray nozzles are depicted, the present invention is not limited to such a configuration, and use of a single spray nozzle, or three or more spray nozzles, in various other physical configurations may also be used.

The first 102 and second 106 cleaning pads are preferably constructed of polyvinyl alcohol (PVA). It is known that PVA is relatively hard when dry, but softens when it is wetted. Thus, as noted above, the cleaning pads 102, 106 are preferably kept wetted. It will be appreciated that PVA is exemplary of a preferred material for use in carrying out the present invention, and that other materials known in the art may also be used.

Figure 3:
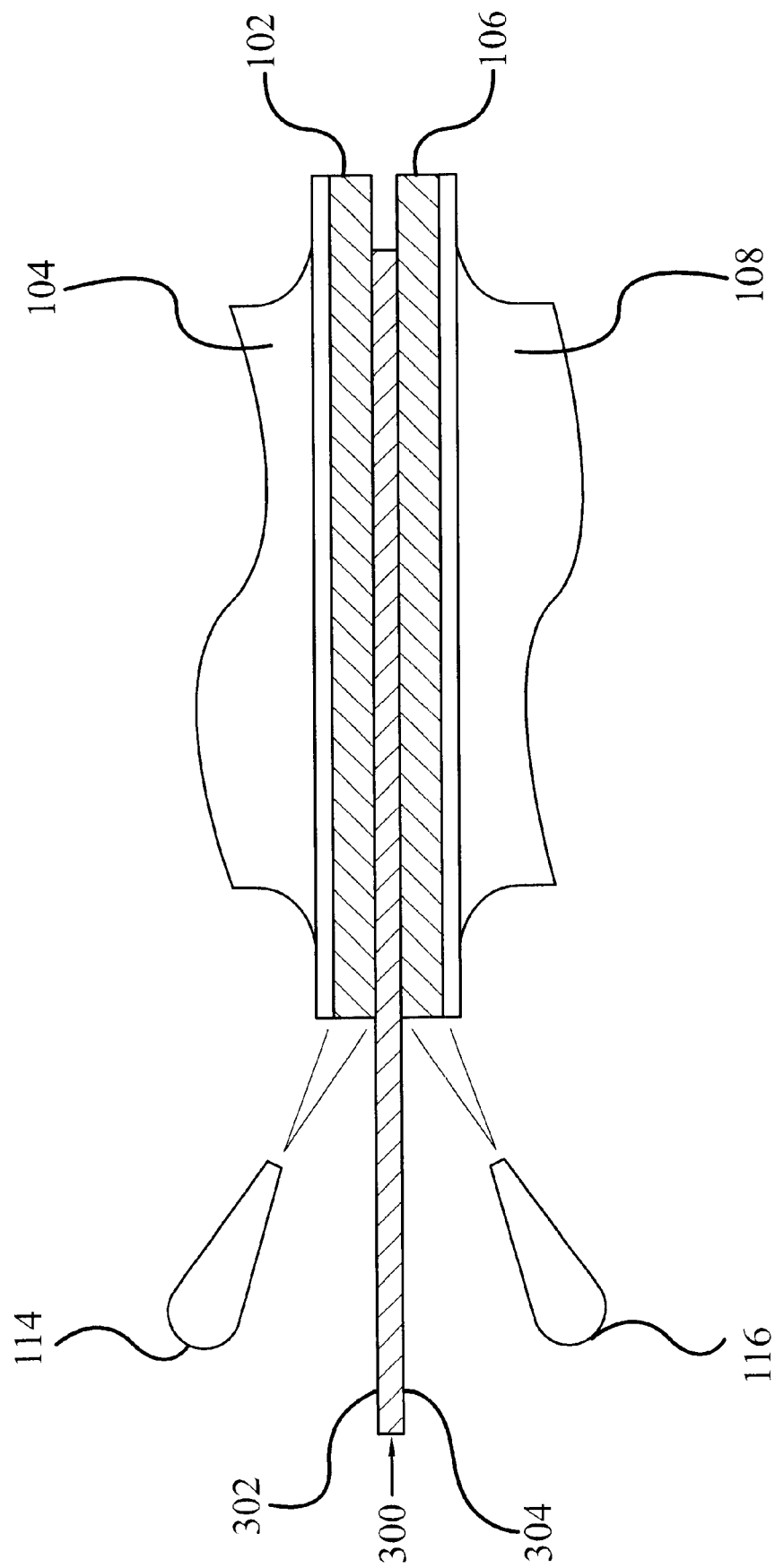
FIG. 3 is a side view of a portion of the exemplary work piece cleaning station depicted in FIGS. 1 and 2, depicting a work piece being cleaned.
Figure 4:
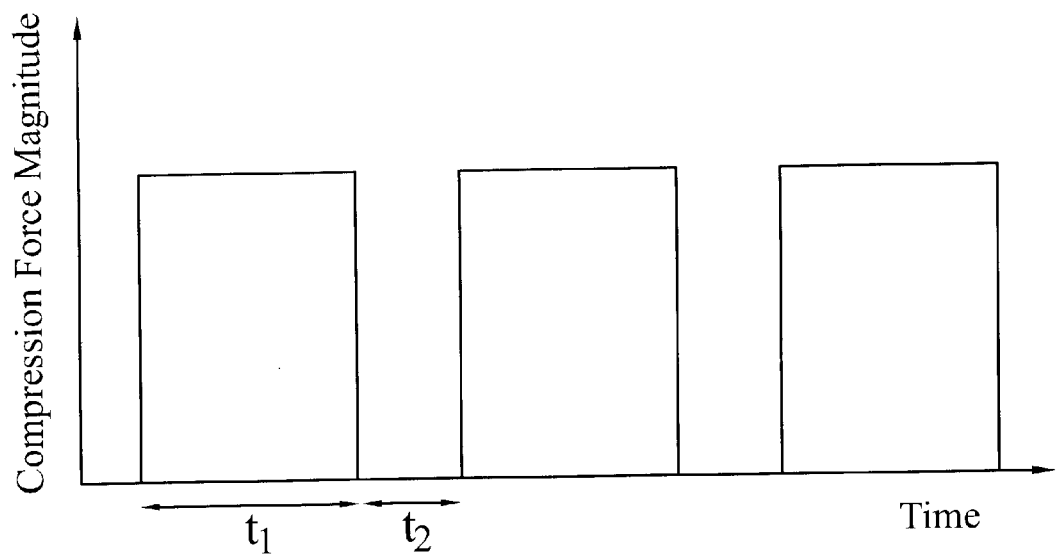
FIGS. 4–7 depict various force application versus time profiles according to exemplary embodiments of the present invention.

With reference briefly to FIG. 3, in combination with FIGS. 1 and 2, the process for cleaning a particular work piece using the depicted cleaning system 100 will be described. As depicted in FIG. 3, a work piece 300 is positioned within the cleaning station 100 and is sandwiched between, and vertically supported by, the first 102 and second 106 cleaning pads, by vertically displacing either or both of the upper 104 and lower 108 cleaning pad mounts. While not depicted in FIG. 3, it should be understood that the wafer 300 is laterally supported by the plurality of bearing elements 112. The upper 104 and lower 108 cleaning pad mounts are then rotated, thus concomitantly rotating the respective first 102 and second 106 cleaning pads. The rotating first cleaning pad 102 cleans a first surface 302 of the work piece 300, while the rotating second cleaning pad 106 cleans a second surface 304 of the work piece 300. While the first 102 and second 106 cleaning pads are cleaning the first 302 and second 304 surfaces of the work piece 300, the fluid nozzles 114, 116 are spraying a cleaning fluid onto the work piece 300. Cleaning the work piece 300 in the presence of the cleaning fluid removes debris, such as contaminants, particulate, and residue from the work piece surfaces 302, 304, which come from various preceding processing steps. The cleaning fluid used will depend upon the particular type of work piece 300 being cleaned and the type of debris being removed therefrom. Thus, the fluid may comprise, for example, de-ionized (DI) water, dilute ammonium hydroxide, dilute or buffered hydrofluoric acid, solvents, surfactants, or detergents.

As previously noted, a portion of the debris removed from the work piece 300 adheres to, or is embedded in, the first 102 and second 106 cleaning pads. Thus, after the work piece 300 has been cleaned, as described above, it is removed from the cleaning system 100, and either another work piece 300 is cleaned, or the cleaning pads 102, 106 are cleaned. The number of work pieces 300 that are cleaned before the debris is removed from the cleaning pads 102, 106 may vary. A particular work piece and fabrication process may require the debris be removed after each work piece 300 is cleaned. Another process may require debris removal after every ten or twenty work pieces 300 are cleaned. The particular predetermined number of work piece cleanings is optimized for each particular process and by each particular user. Alternatively, rather than cleaning the pads 102, 106 after a predetermined number of work piece cleanings, the cleaning pads 102, 106 may be cleaned after the debris concentration on the surface of one or both cleaning pads 102, 106 has reached a predetermined level, which may be sensed using any one of numerous sensing devices known in the art.

Returning once again to FIGS. 1 and 2, the cleaning pad debris removal process of the present invention will now be discussed. Referring first to FIG. 1, the cleaning pads 102, 106 are shown in their post work piece cleaning positions. That is, the cleaning pads 102, 106 are spaced apart from one another with no work piece 300 sandwiched there between. Thereafter, if the predetermined number of work pieces 300 have been cleaned, or the concentration of debris on the cleaning pads 102, 106 has reached a predetermined level, the first 102 and second 106 cleaning pads are cyclically compressed together, as depicted in FIG. 2. More particularly, the upper 104 and lower 108 cleaning pad mounts are cyclically moved toward one another a predetermined distance, thereby creating a compression force between the first 102 and second 106 cleaning pads that is cyclically applied and removed. This cyclical application and removal of the compression force, defined herein as a force application/removal cycle, recurs a predetermined number of times. The predetermined number of application/removal cycles is optimized for the particular process and machine.

By causing the first 102 and second 106 cleaning pads to undergo the predetermined number of force application/removal cycles, much of the debris that is adhered to, and embedded in, the cleaning pads 102, 106 is released from the cleaning pads 102, 106. Hence, application of a rinsing fluid from one or more of the spray nozzles 114, 116 effectively removes the released debris therefrom. The rinsing fluid used to remove the debris from the cleaning pads 102, 106 may be the same fluid used to clean the wafer 300, or a different fluid, such as DI water or ammonium hydroxide.

The specific timing, duration, and configuration of the rinsing fluid application via the spray nozzles 114, 116 may be optimized for the particular process and machine. For example, in one embodiment of the present invention, the rinsing fluid is applied continuously, from either or both nozzles 114, 116, throughout each force application/removal cycle. In another embodiment, the rinsing fluid is applied from either or both nozzles 114, 116 only during the removal portion (see FIG. 1) of the force/application removal cycle. In yet another embodiment, the rinsing fluid is applied from either or both nozzles 114, 116 intermittently throughout each force application/removal cycle.

The efficiency of the debris removal process may also be increased by continuously or periodically rotating the cleaning pads 102, 106 in a synchronized fashion and at a relatively high speed. The particular speed at which the pads are rotated is not of criticality to the present invention, but is chosen to optimize the cleaning process efficiency. Additionally, the particular periodicity of this rotation may vary. For instance, in one exemplary embodiment, the cleaning pads 102, 106 are rotated only during a removal portion of a force/application removal cycle. That is, when the cleaning station is as depicted in FIG. 1. It is to be appreciated that this high speed rotation may occur during the removal portion of each force application/removal cycle, or during the removal portion of selected force application/removal cycles. In another exemplary embodiment, the cleaning pads 102, 106 are continuously rotated at a relatively high speed throughout each force application/removal cycle. And, in yet another exemplary embodiment, the cleaning pads 102, 106 are rotated at a relatively high speed only during an application portion of each force application/removal cycle. That is, when the cleaning station is as depicted in FIG. 2. Again, it is to be appreciated that this high speed rotation may occur during the application portion of each force application/removal cycle, or during the application portion of selected force application/removal cycles. All of these exemplary pad rotation embodiments may be used in combination with any of the previously described exemplary rinsing fluid application embodiments.

The present invention embodies not only the various high speed rotational embodiments discussed above, but also encompasses various angular displacement embodiments. More particularly, during the removal portion of one or more force application/removal cycles, the cleaning pads 102, 106 are displaced relative to one another a predetermined angular displacement amount. This displacement may be caused by rotating either, or both, of the cleaning pads 102, 106. Displacing the cleaning pads 102, 106 a predetermined angular displacement relative to one another ensures, among other things, that the same physical locations one each cleaning pad 102, 106 do not continuously contact each other during each application portion of each force application/removal cycle.

Figure 5:
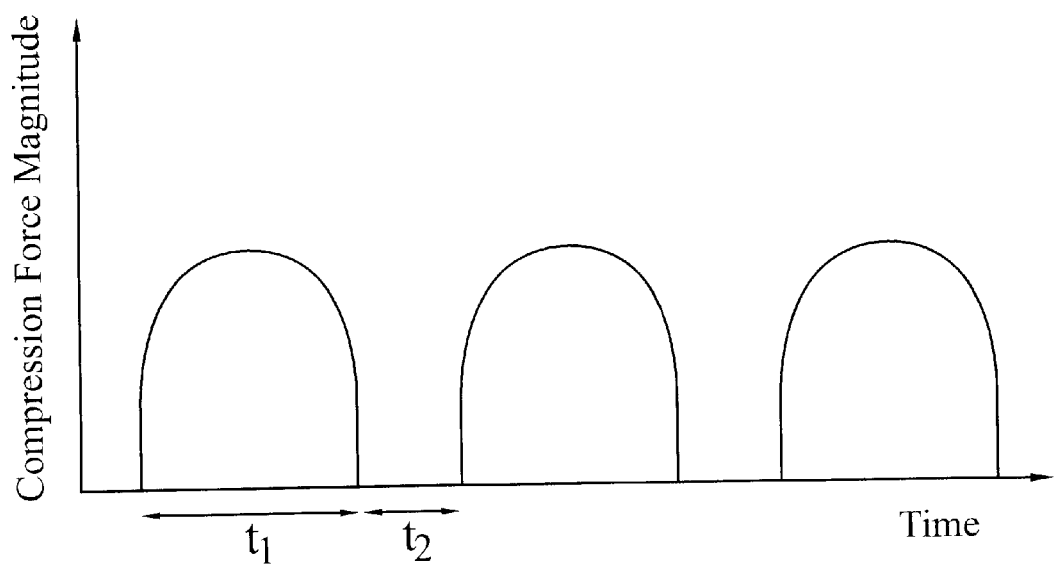
Figure 6:
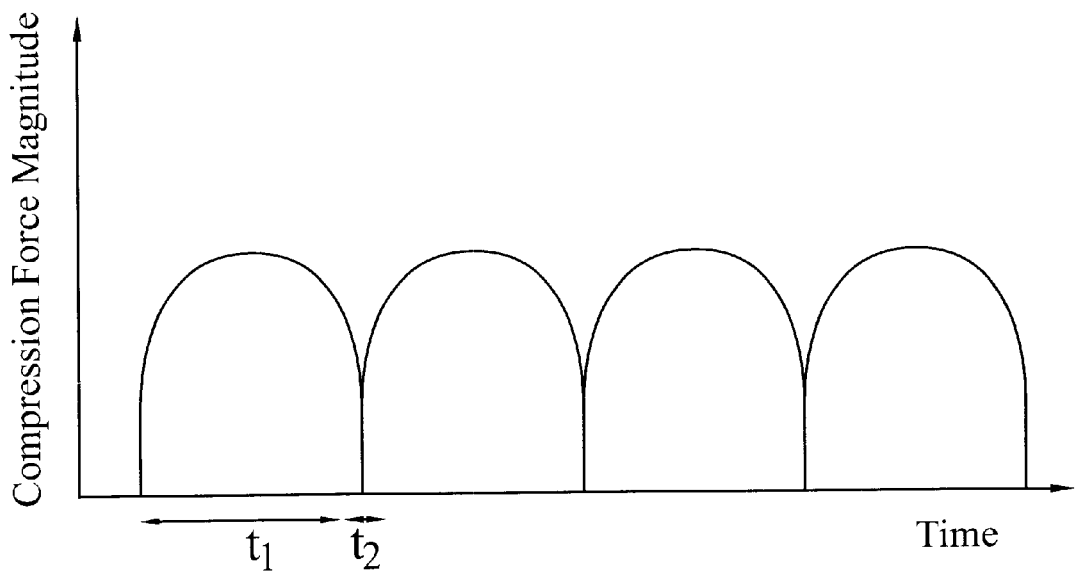
Figure 7:
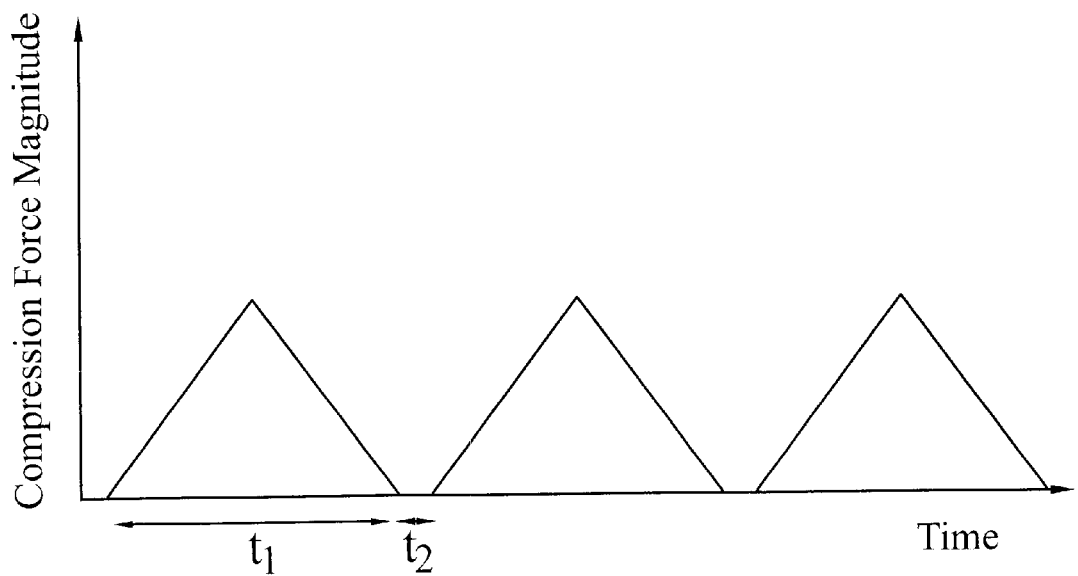

Turning now to FIGS. 4–7, a more detailed description of the variation of the compression magnitude associated with each force application/removal cycle will be provided. As these figures depict, the application and removal portions of each force application/removal cycle occur, respectively, for a first ($t_1$) and second ($t_2$) predetermined time period. In other words, the application portion occurs for a first predetermined time period, and the removal portion occurs for a second predetermined time period. The first and second predetermined time periods may be either equal or unequal, and may be varied to optimize the pad cleaning process. FIGS. 4–7 additionally depict various embodiments of the force application versus time function. For example, the force application versus time function may be a square wave function, a sinusoidal function, or a triangular function. As depicted in FIG. 3, with the square wave function, the magnitude of the applied force is constant during the first predetermined time period. If a sinusoidal function is used, as depicted in FIGS. 5 and 6, the magnitude of the applied force varies sinusoidally during the first predetermined time period. And, as depicted in FIG. 7, with the triangular function, the magnitude of the applied force increases linearly during a first portion of the first predetermined time period, and linearly decreases during a second portion thereof. Again, it should be noted that the first and second predetermined time periods depicted in FIGS. 4–7 may be varied to optimize the pad cleaning process. It is further noted that numerous other force application versus time functions may be implemented and are embodied by the present invention. Those that have been explicitly described and depicted are only exemplary embodiments.

Figure 8:
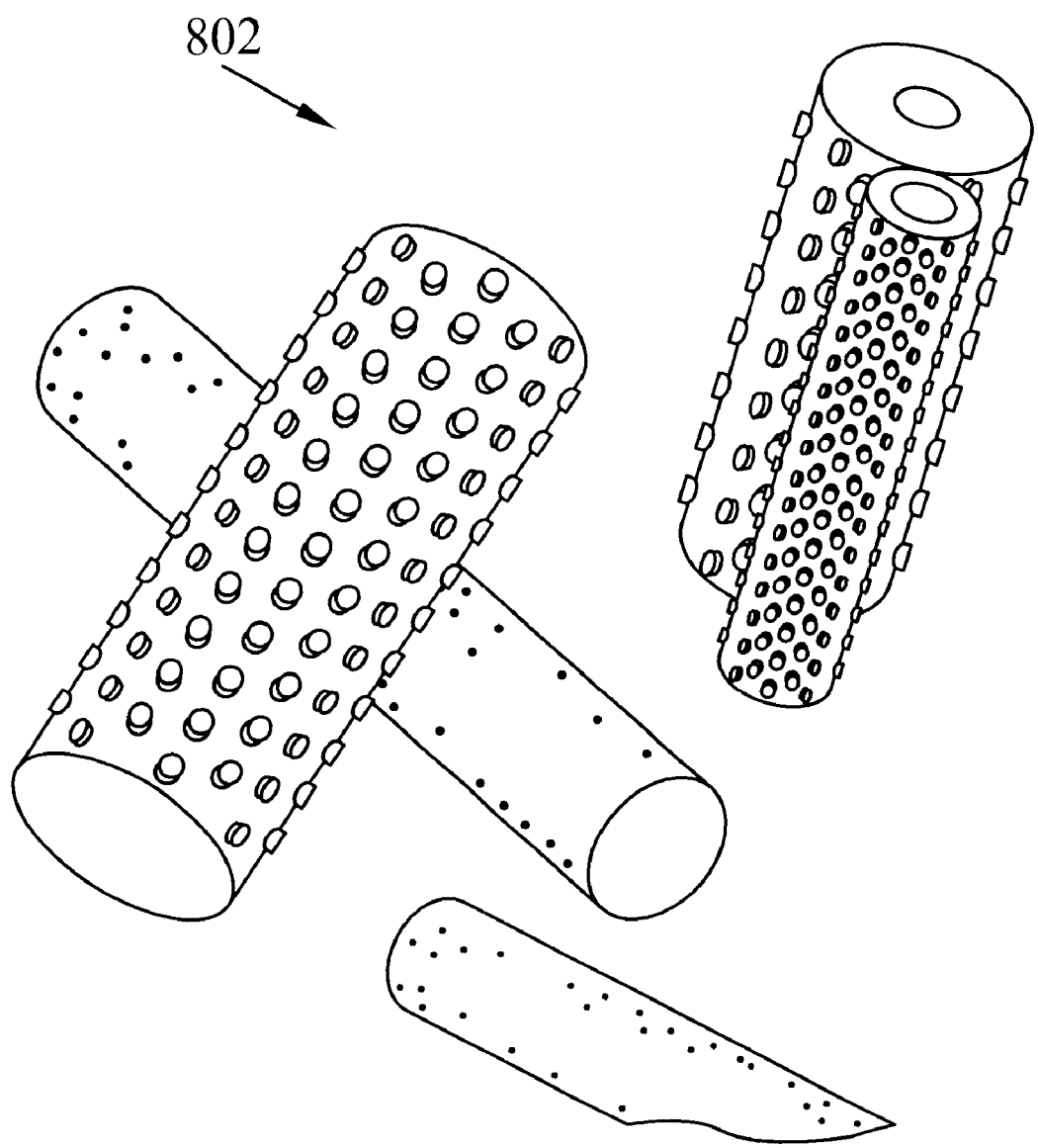
FIGS. 8–10 are perspective views of various exemplary types of work piece cleaning pads that may be employed in an embodiment of the present invention.
Figure 9:
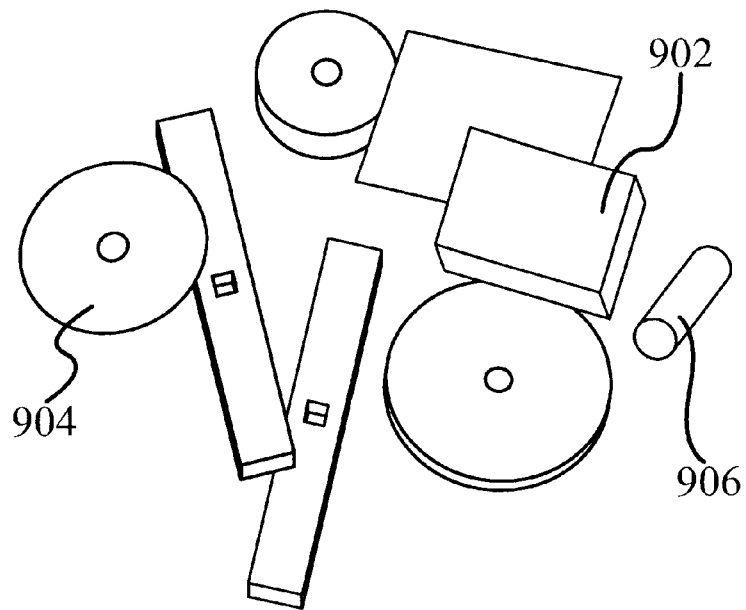
Figure 10:
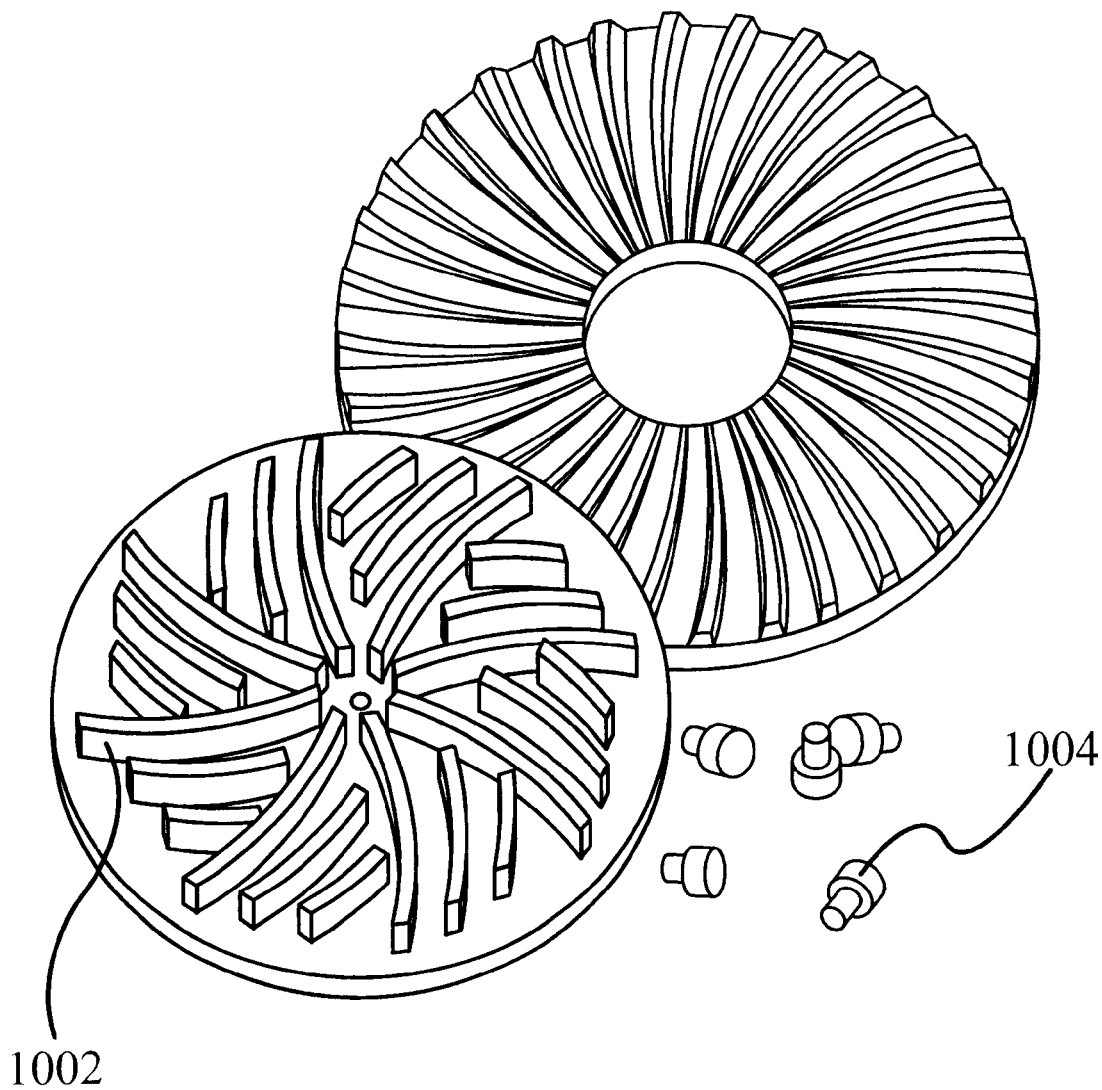
Figure 11:
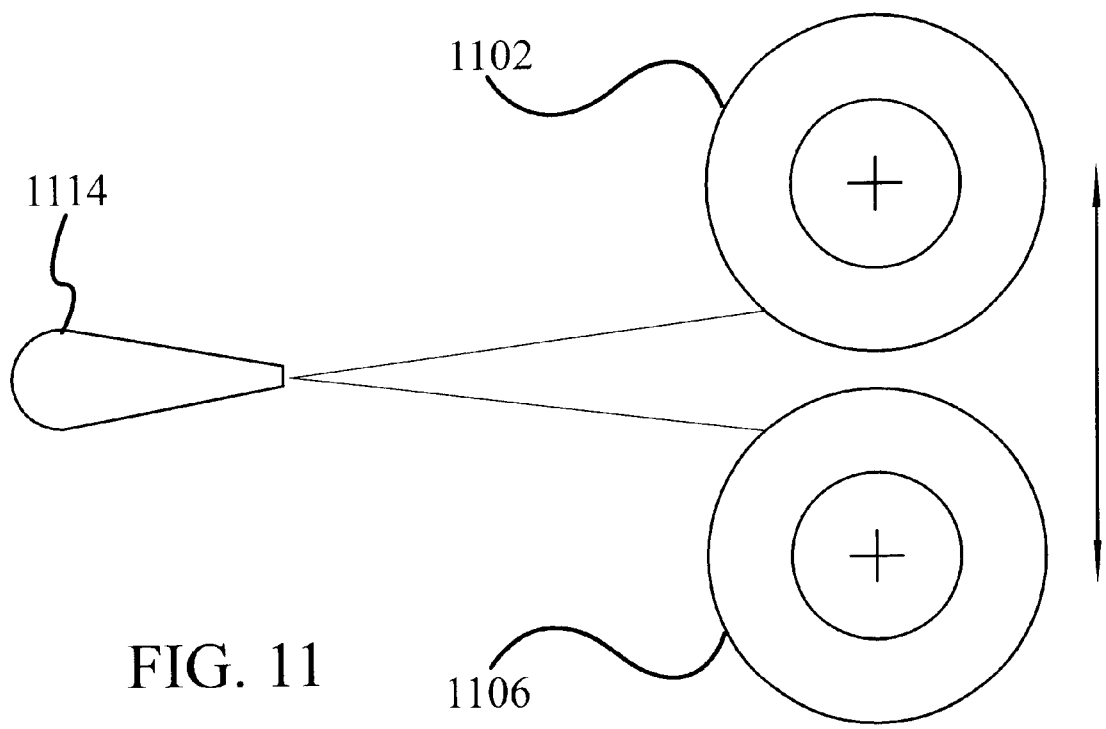
FIGS. 11 and 12 are side views of a pair of cylindrically shaped cleaning pads employed in an embodiment of the present invention.

Up to this point, the invention has been described and depicted as being applied to disk shaped pads, in a so-called "pancake" type of configuration. It will be appreciated, however, that the present pad cleaning methodology is applicable to various types of cleaning pads and configurations known in the art. Various other exemplary cleaning pad embodiments are depicted in FIGS. 8–10. As FIG. 8 depicts, the cleaning pads may be cylindrically shaped pads 802 of varying diameters and external contours. The pads illustrated in FIG. 9 illustrate that the pads may be in the form of wipes 902, or may be flat 904, or various other customized shapes 906. These pads may also be of varying size and external contour. Finally, FIG. 10 depicts disk shape cleaning pads 1002 and so-called "pencil-type" cleaning pads 1004 together. It is to be appreciated that these types of pads may also be of varying size and external contour.

Figure 12:
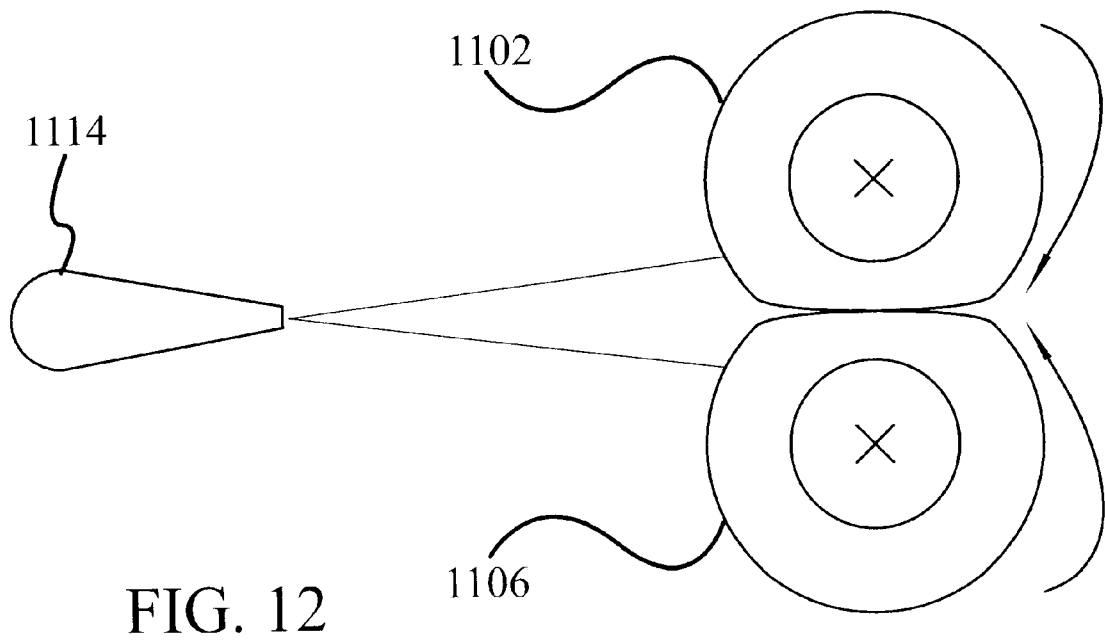

By way of completeness of illustration, FIG. 12 is provided to depict the application of the present invention to a pair of the above-described cylindrically shaped cleaning pads 1202, 1206. As with the pancake type of cleaning pads 102, 106 described explicitly herein above, a predetermined number of force application/removal cycles are applied to the cleaning pads 1020, 1206, and a rinsing fluid is applied from one or more spray nozzles 1214, to facilitate debris removal therefrom. Each of the various embodiments previously discussed with respect to the pancake type of cleaning pads 102, 106 are applicable to this alternative cleaning pad arrangement, as well.

Figure 14:
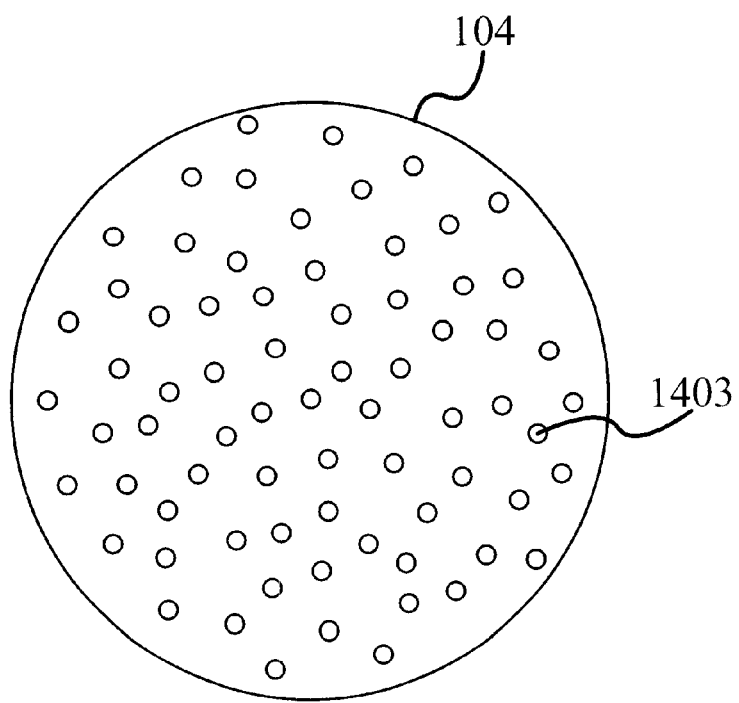
FIG. 14 is an end view of a cleaning pad mount used in the work piece cleaning station of FIG. 13.
Figure 13:
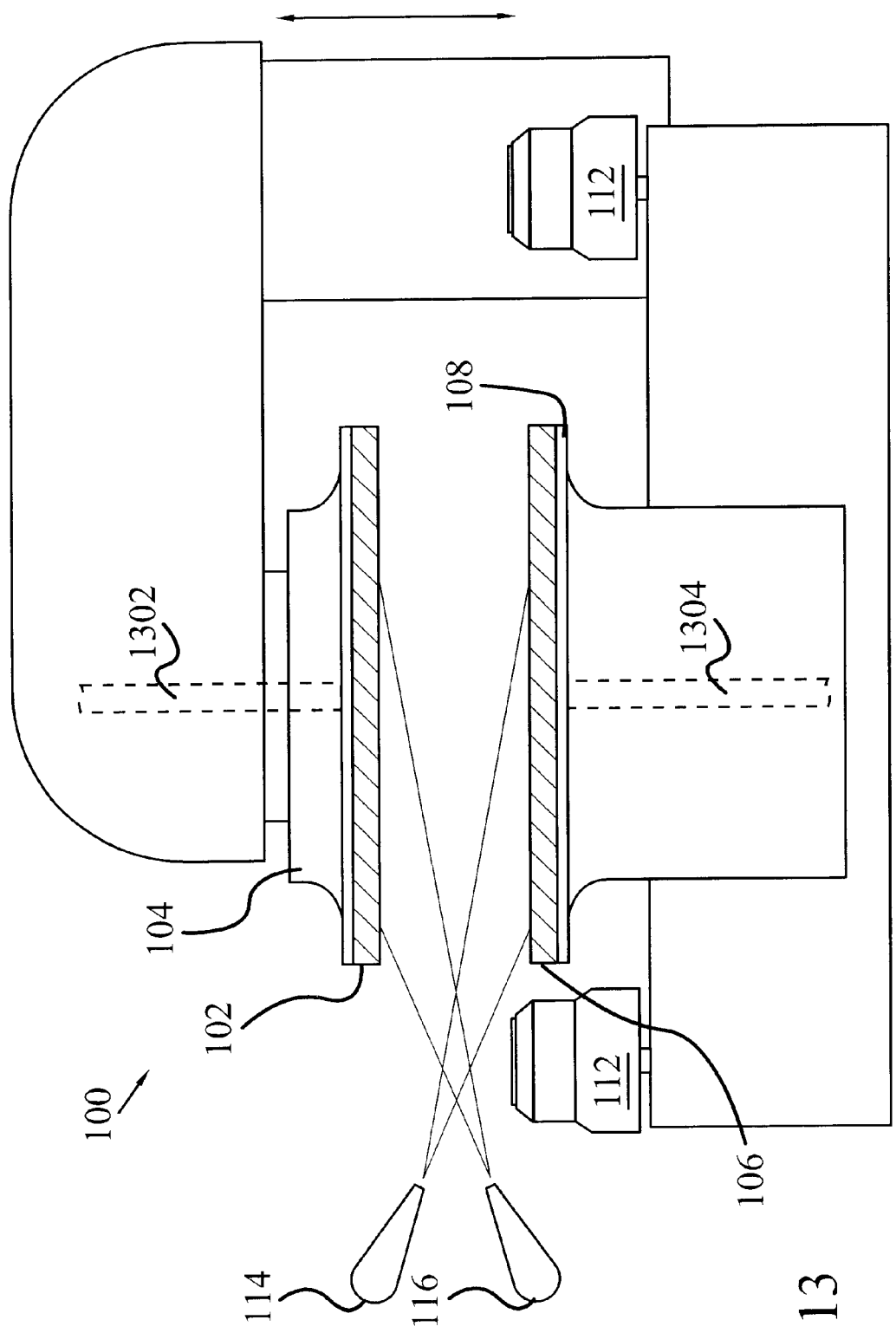
FIG. 13 depicts a simplified side view of an alternative work piece cleaning station employing an embodiment of the present invention.

In addition to the variations in cleaning pad design discussed immediately above, the present invention encompasses variations in the method of applying rinsing fluid to the cleaning pads. Specifically, as depicted in FIG. 13, the rinsing fluid may be delivered through either or both of the cleaning pads 102, 106. In this embodiment, the upper 104 and lower 108 cleaning pad mounts are in fluid communication with a non-depicted fluid reservoir, via one or more conduits 1302, 1304 (shown in phantom). As depicted in FIG. 14, the cleaning pad mounts 104, 108 (only one of which is depicted) each include a plurality of perforations 1403. Thus, the rinsing fluid flows from the fluid reservoir, through the perforations 1403, and into and through the cleaning pads 102, 106. It is noted that this method of fluid delivery may be used with all of the previously described cleaning pad variations.

Figure 15:
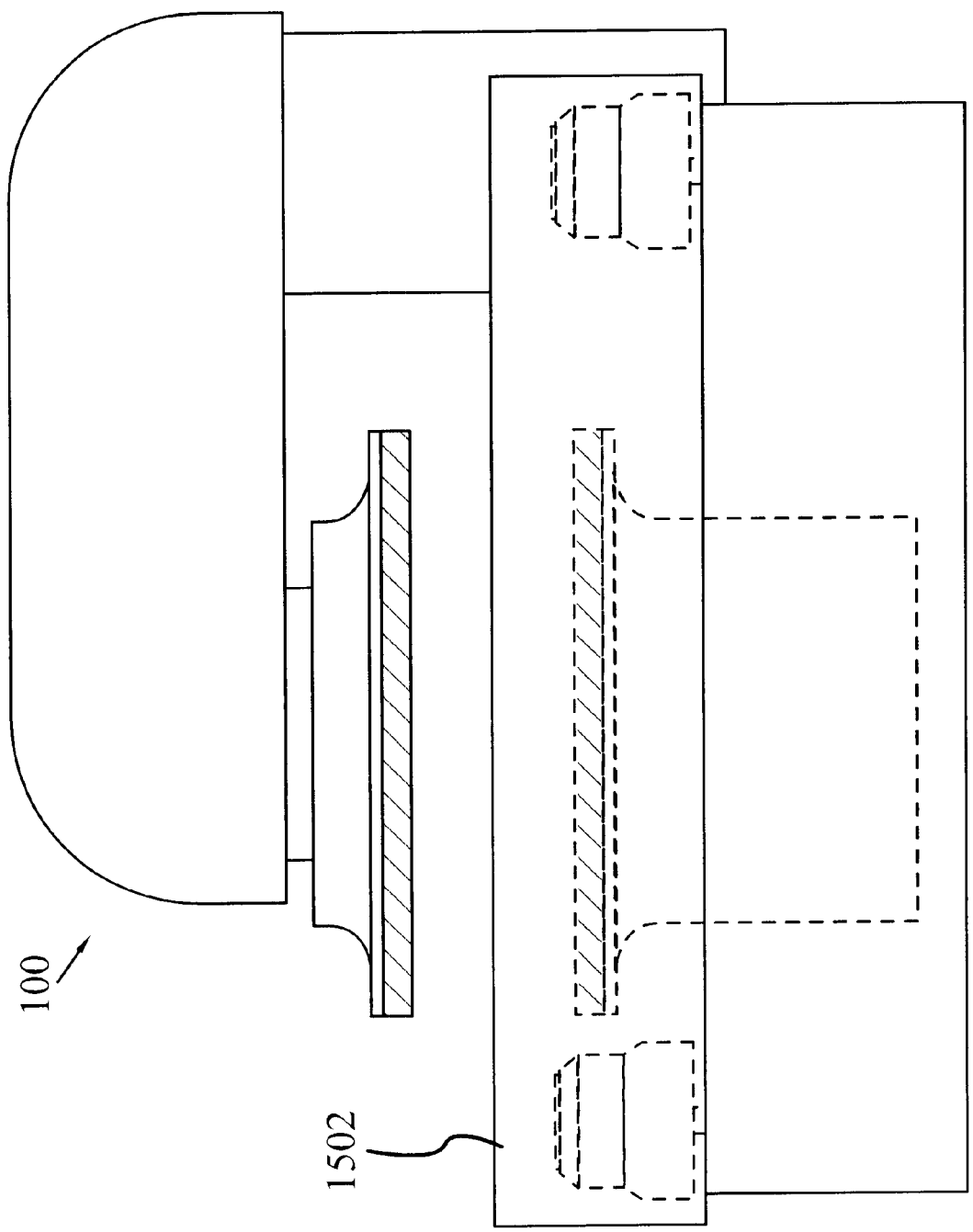
FIG. 15 depicts a simplified side view of yet another alternative work piece cleaning station employing an embodiment of the present invention.

Yet another arrangement for applying the rinsing fluid to the cleaning pads 102, 106 is depicted in FIG. 15. As illustrated therein, with this particular arrangement, a fluid tight receptacle 1502 is provided that allows either or both of the cleaning pads 102, 106 to be submerged prior to, during, or after one or more force application/removal cycles, or any combination thereof. Although depicted as being integral with the cleaning station 100, it will be appreciated that the fluid tight receptacle 1502 may also be separate from the cleaning station 100.

The present invention provides various advantages over previous known methods of removing debris from work piece cleaning pads. For example, the present invention does not require a separate station or system for removing debris from the cleaning pads, does not require the use of special filler wafers to remove the debris therefrom, nor does it require frequent replacement of the cleaning pads.

While the invention has been described with reference to a preferred embodiment, it will be understood by those skilled in the art that various changes may be made and equivalents may be substituted for elements thereof without departing from the scope of the invention. Moreover, although various modifications of the invention have been described individually, it is to be appreciated that these individual modifications may be used in any desired combination to achieve the desired outcome. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A method of removing debris from one or more cleaning pads in a work piece cleaning apparatus, comprising the steps of:
   the step of removing the debris by cyclically applying and removing a compression force to cause a first cleaning pad to compress against a second cleaning pad, the cyclical application and removal of the compression force occurring for a number of force application/removal cycles; and
   applying a rinsing fluid to at least one of the first and second cleaning pads during the step of removing the debris.

2. The method of claim 1, wherein the rinsing fluid is applied continuously throughout each force application/removal cycle.

3. The method of claim 1, wherein the rinsing fluid is applied intermittently during each force application/removal cycle.

4. The method of claim 1, wherein applying the rinsing fluid occurs only during a removal portion of each force application/removal cycle.

5. The method of claim 1, wherein applying the rinsing fluid comprises spraying the rinsing fluid onto one or both of the first and second cleaning pads via spray nozzles positioned proximate thereto.

6. The method of claim 1, wherein applying the rinsing fluid comprises submerging the first and second cleaning pads in the rinsing fluid.

7. The method of claim 1, wherein applying the rinsing fluid comprises delivering the rinsing fluid through either one or both of the first and second cleaning pads.

8. The method of claim 1, further comprising:
   rotating the first and second cleaning pads at a high rotational speed during a removal portion of each force application/removal cycle.

9. The method of claim 8, wherein the rinsing fluid is applied while rotating the first and second cleaning pads.

10. The method of claim 1, further comprising:
    continuously rotating the first and second cleaning pads synchronously at a high rotational speed throughout each force application/removal cycle.

11. The method of claim 1, further comprising:
    rotating the first and second cleaning pads synchronously at a high rotational speed during an application portion of each force application/removal cycle.

12. The method of claim 1, further comprising: displacing the first and second cleaning pads relative to one another at an angular displacement during a removal portion of each force application/removal cycle.

13. The method of claim 1, where in an application portion of each force application/removal cycle occurs for a first predetermined time period, and a removal portion of each force application/removal cycle occurs for a second predetermined time period.

14. The method of claim 13, wherein the first and second predetermined time periods are substantially equal.

15. The method of claim 13, wherein the compression force has a magnitude that is constant during the first predetermined time period.

16. The method of claim 13, wherein the compression force has a magnitude that varies during the first predetermined time period.

17. The method of claim 16, wherein the compression force magnitude variation is sinusoidal.

18. The method of claim 16, wherein the compression force magnitude variation is linearly increasing during a first portion of the first predetermined time period and linearly decreasing during a second portion of the first predetermined time period.

19. The method of claim 13, wherein the first and second predetermined time periods are substantially unequal.

20. A method of cleaning a work piece, comprising:
    bringing a first surface of the work piece into contact with a first cleaning pad;
    bringing a second surface of the work piece into contact with a second cleaning pad;
    in the presence of a cleaning fluid, cleaning one or more of the first and second surfaces of the work piece with the first and second cleaning pads;
    removing the work piece from contact with the first and second cleaning pads; and cleaning the first and second cleaning pads, wherein a step of cleaning the first and second cleaning pads comprising the steps of:

cyclically applying and removing a compression force to cause the first cleaning pad to compress against the second cleaning paid, the cyclical application and removal of the compression force occurring for a number of force application/removal cycles; and applying a rinsing fluid to at least one of the first and second cleaning pads during the step of cleaning the first and second cleaning pads.

21. The method of claim 20, further comprising:

cleaning a number of work pieces before cleaning the first and second cleaning pads.

22. The method of claim 20, wherein the rinsing fluid is applied continuously throughout each force application/removal cycle.

23. The method of claim 20, wherein the rinsing fluid is applied intermittently during each force application/removal cycle.

24. The method of claim 20, wherein the step of applying the rinsing fluid occurs only during a removal portion of each force application/removal cycle.

25. The method of claim 20, wherein the step of applying the rinsing fluid comprises spraying the rinsing fluid onto one or both of the first and second cleaning pads via spray nozzles positioned proximate thereto.

26. The method of claim 20, wherein the step of applying the rinsing fluid comprises submerging the first and second cleaning pads in the rinsing fluid.

27. The method of claim 20, wherein the step of applying the rinsing fluid comprises delivering the rinsing fluid through either one or both of the first and second cleaning pads.

28. The method of claim 20, further comprising:

rotating the first and second cleaning pads at a high rotational speed during a removal portion of each force application/removal cycle.

29. The method of claim 28, wherein the rinsing fluid is applied while rotating the first and second cleaning pads.

30. The method of claim 20, further comprising:

continuously rotating the first and second cleaning pads synchronously at a high rotational speed throughout each force application/removal cycle.

31. The method of claim 20, further comprising:

rotating the first and second cleaning pads synchronously at a high rotational speed during an application portion of each force application/removal cycle.

32. The method of claim 20, further comprising:

displacing the first and second cleaning pads relative to one another at an angular displacement during a removal portion of each force application/removal cycle.

33. The method of claim 20, wherein an application portion of each force application/removal cycle occurs for a first predetermined time period, and a removal portion of each force application/removal cycle occurs for a second predetermined time period.

34. The method of claim 33, wherein the first and second predetermined time periods are substantially equal.

35. The method of claim 33, wherein the compression force has a magnitude that is constant during the first predetermined time period.

36. The method of claim 33, wherein the compression force has a magnitude that varies during the first predetermined time period.

37. The method of claim 36, wherein the compression force magnitude variation is sinusoidal.

38. The method of claim 36, wherein the compression force magnitude variation is linearly increasing during a first portion of the first predetermined time period and linearly decreasing during a second portion of the first predetermined time period.

39. The method of claim 33, wherein the first and second predetermined time periods are substantially unequal.

* * * * *